(12) United States Patent
Sugiyama

(10) Patent No.: US 6,909,662 B2
(45) Date of Patent: Jun. 21, 2005

(54) DATA READ CIRCUIT IN A SEMICONDUCTOR DEVICE FEATURING REDUCED CHIP AREA AND INCREASED DATA TRANSFER RATE

(75) Inventor: Akio Sugiyama, Kawasaki (JP)

(73) Assignee: NEC Electronic Corporation, Kanagawa (JP)

( * ) Notice: Subject to any disclaimer, the term of this patent is extended or adjusted under 35 U.S.C. 154(b) by 0 days.

(21) Appl. No.: 10/660,518

(22) Filed: Sep. 12, 2003

(65) Prior Publication Data

US 2004/0051121 A1 Mar. 18, 2004

(30) Foreign Application Priority Data

Sep. 13, 2002 (JP) ........................................ 2002-268865

(51) Int. Cl.$^7$ ................................................. G11C 8/00
(52) U.S. Cl. ............................. 365/230.05; 365/230.03; 365/233
(58) Field of Search ........................ 365/230.05, 230.03, 365/233, 203

(56) References Cited

U.S. PATENT DOCUMENTS 5,204,841 A * 4/1993 Chappell et al. ....... 365/230.05

5,991,230 A * 11/1999 Urakawa ................ 365/230.03

FOREIGN PATENT DOCUMENTS

| JP | 3-73493 A | 3/1991 |
|---|---|---|
| JP | 6-150659 A | 5/1994 |
| JP | 8-153393 A | 6/1996 |
| JP | 9-265780 A | 10/1997 |
| JP | 10-134578 A | 5/1998 |

* cited by examiner

*Primary Examiner*—Huan Hoang
(74) *Attorney, Agent, or Firm*—Sughrue Mion, PLLC

(57) ABSTRACT

A read circuit in a semiconductor device includes a circuit for determining whether data that have been read from a plurality of circuit blocks are to be supplied as output to the outside, and a discharging circuit that is inserted in cascade connection in data lines that are shared with a succeeding circuit blocks. If the output data that are to be transferred are at a low level, the discharging circuit is set to a conductive state and the data line that is shared with the succeeding circuit block is discharged, and if at a high level, the shared data line is precharged by a precharging circuit. This control operation is successively repeated as far as the lowest-order circuit block to supply, as output, data of a logic level that corresponds to the output data.

16 Claims, 15 Drawing Sheets

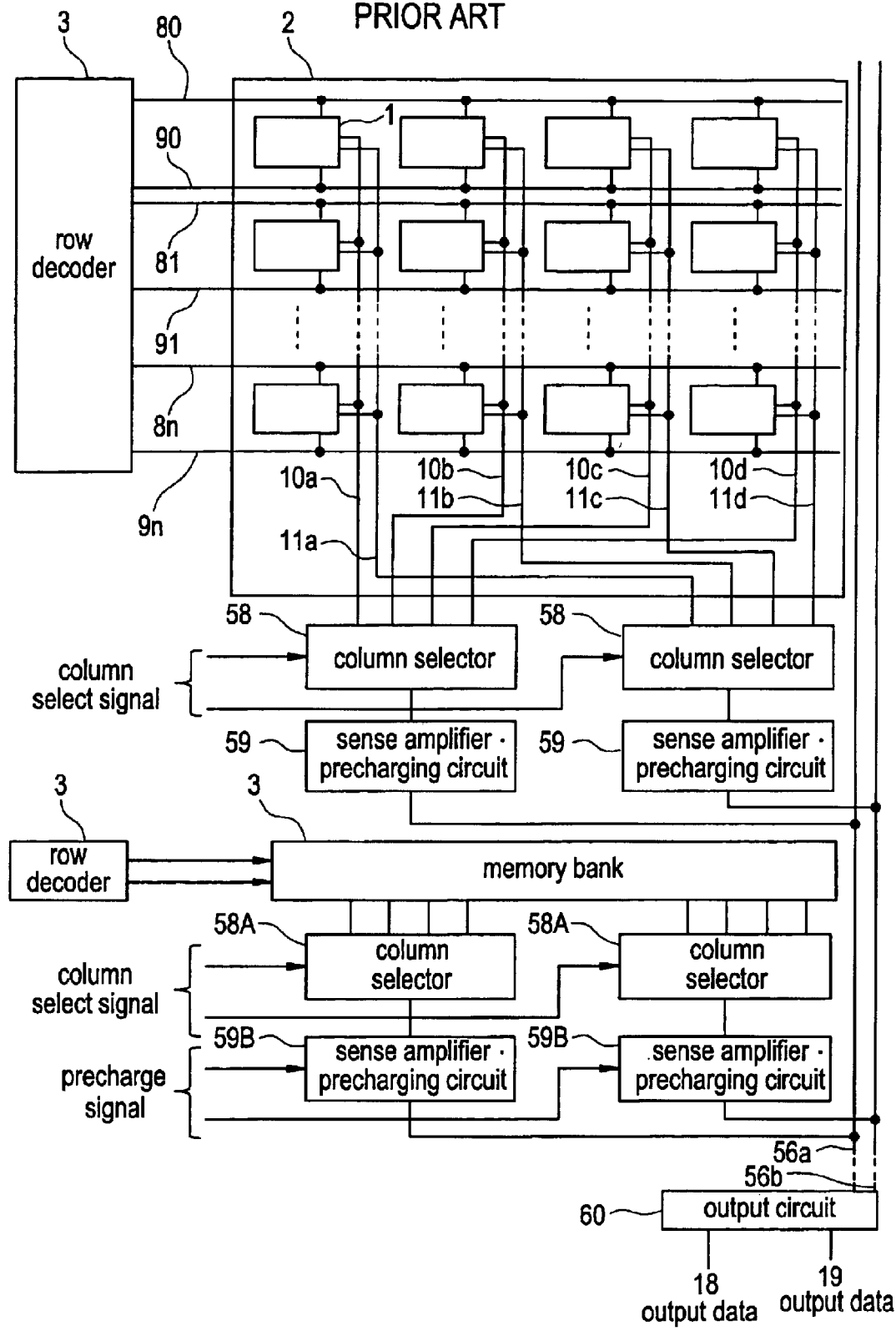

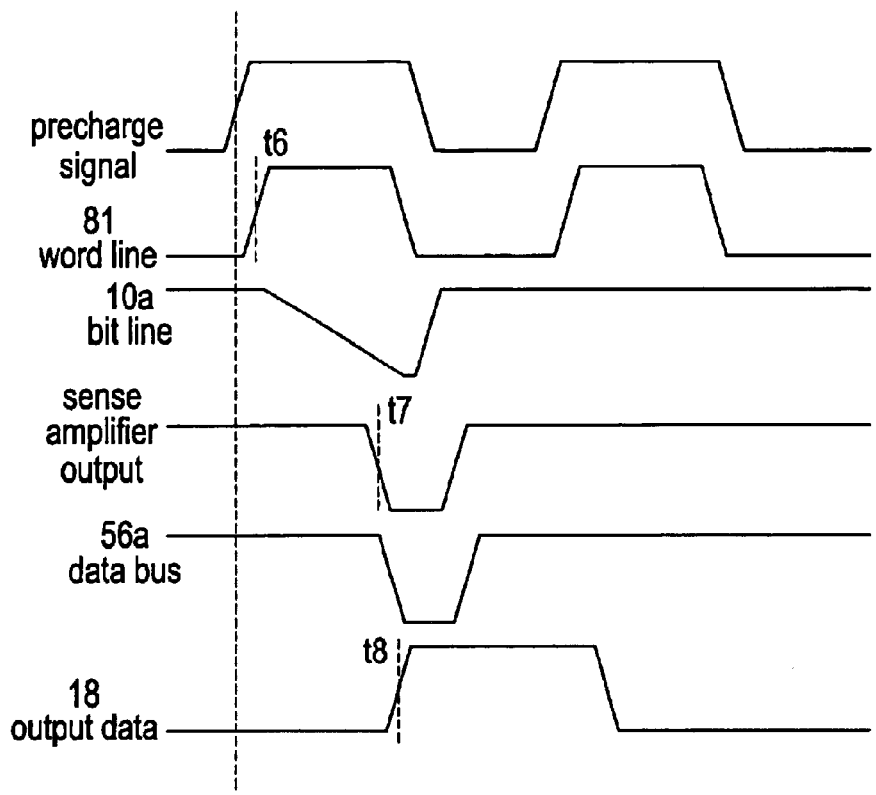
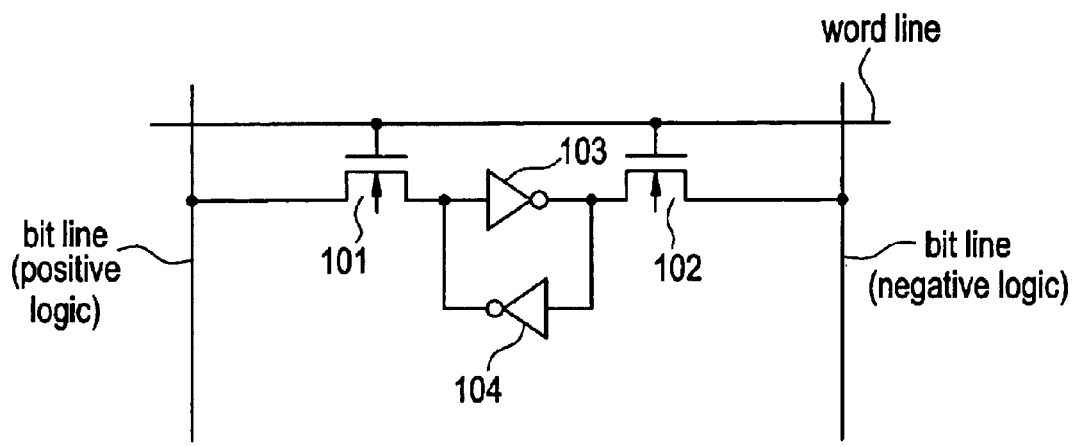

DATA READ CIRCUIT IN A SEMICONDUCTOR DEVICE FEATURING REDUCED CHIP AREA AND INCREASED DATA TRANSFER RATE

BACKGROUND OF THE INVENTION

1. Field of the Invention

The present invention relates to a data read circuit of a semiconductor device.

2. Description of the Related Art

The development of microtechnology of semiconductor elements in recent years has been accompanied by the increasing scale of the LSI that is composed of these semiconductor elements. This development has been particularly dramatic in the field of semiconductor memory devices. As examples, dynamic random access memory (DRAM) has been put into practical use as semiconductor memory devices having a capacity of 256 megabytes on one chip, as has static random access memory (SRAM) having a capacity of 18 megabytes on one chip.

Referring now to FIG. 1, which shows the construction of a multiport memory cell that employs a single-end mode, it can be seen that in these types of semiconductor memory devices, a reduction in the area of the memory cell is obtained through the use of the single-end mode in the bit lines for read. The single-end mode is a mode for transferring cell data by a single bit line.

FIG. .2 shows an example of the construction of multiport RAM. As shown in FIG. 2, the basic structure of the memory is constituted by providing multiport RAM with: memory cells that are arranged at the intersections of intersecting horizontal lines and vertical lines; word lines 420, 421~42n, 430, 431~43n and 440, 441~44n for individually selecting row addresses for each port; bit lines 45, 46, 47, and 48 for propagating data of the memory cells; precharging circuit 49 for precharging bit lines 45, 46, 47, and 48; write port column selector 50 for selecting column addresses; read port column selector 51; read circuit 53 at the read port for data that have been propagated on bit lines; data output circuit 55; write circuit 52 at the write port for propagating write data on bit lines; and data input circuit 54.

FIG. 3 shows a timing chart for reading data of the multiport RAM of FIG. 2. Referring now to FIG. 3, as shown in interval A, read bit line 48 that has been precharged by means of precharging circuit 49 is discharged by the data of the memory cell that is selected at timing t1 of the rise of word line 440. In some cases, this potential is determined to be low-level at timing t2 at which this potential falls below the theoretical threshold value of read circuit 53, read signal becoming high level at t3 and data output 18 becoming high level at timing t4. In other cases, the potential of bit line 48 is maintained without change and determined to be high level and data are supplied as output as shown in interval B.

FIG. 4 shows a timing chart for a case in which increase in capacitance of the bit line causes the discharge time to increase. Referring to FIG. 4, an increase in the number of rows of memory causes an increase in the capacitance of the bit line, and it can be seen that the time required for the discharge of bit line 48 (t2~1) thus increases and the reading speed accordingly decreases.

In order to cope with large capacity, a configuration was adopted in the prior art for enabling high-speed reading in a memory having high capacity in which the memory was divided into a plurality of banks, addresses were selected in bank units, and the data that were read were transferred to the output circuit through a data bus.

Referring to FIG. 5, this configuration comprises: a plurality of memory banks 2 in which memory cells are arranged at each of the intersections of intersecting horizontal lines and vertical lines; row decoder 3 that is connected to each of the memory banks for selecting row addresses; column selector 58 for selecting column addresses; sense amplifier precharging circuit 59 for amplifying data that have been selected by column selector 58 and precharging bit lines; output circuit 60 for supplying the data as output; and data buses 56a and 56b for transferring data between output circuit 60 and sense amplifier precharging circuit 59.

A read operation of this scheme is next described with reference to the timing chart of FIG. 6. Word line 81 of a memory bank that has been selected with bit lines in a precharged state rises at timing t6, bit line 10a is discharged, and at timing t7, the output of the sense amplifier amplifies the data of word line 81. The amplified data are transferred as far as output circuit 60 by means of data buses 56a and 56b and then supplied as output at timing t8, whereby high-speed read is realized in the large-capacity memory. In other words, the division of the memory cell area of the large-capacity memory into a plurality of blocks is a requisite technique for accelerating the reading process.

Another example of accelerating the bit line speed is disclosed in Japanese Patent No. 2892697. The semiconductor memory device disclosed in this publication realizes an increase in speed through the use of a differential sense amplifier, which is typically used in differential-mode bit lines, for amplifying the difference in potential between a reference signal and single-end mode bit lines.

As shown in FIG. 7, which shows the structure of single-port RAM cells, the differential mode refers to a mode in which cell data are propagated on two lines of positive and negative logic, as with the bit lines of single-port RAM.

Japanese Patent Laid-Open No. H10-134578 discloses the insertion on of a buffer circuit in the bit lines between the plurality of blocks into which a memory element unit has been divided for either amplifying and supplying the output or cutting off the output in accordance with the selection of elements of input-side blocks or output-side blocks.

As described in the foregoing explanation regarding a semiconductor memory device of the prior art, a method in which the memory is divided into a plurality of blocks necessitates column selectors for each memory bank unit, and further, a multiport memory necessitates a number of column selectors equal to the number of ports, and the area of the device therefore increases proportionally. Furthermore, column decoders for operating the column selectors are similarly required, and this requirement results in further increase in the chip area.

In addition, regions for the data bus lines for transferring data of each block are also required for each port, further increasing the chip area. In a memory that is frequently used in a multibit construction, such as in a multiport memory, the influence of the area of the data bus regions that are held in bit units is particularly significant.

In the example of Japanese Patent No. 2892697, which uses reference signals, and further, uses differential sense amplifiers, the amount of discharge of bit lines required to obtain the desired differential potential is approximately twice that of the differential scheme, and increasing speed when the capacitance is high is therefore problematic.

In the construction disclosed in Japanese Patent Laid-Open No. H10-134578, moreover, an increase in the amount of capacitance that accumulates in bit lines slows the change in the output signal of the buffer circuit inserted between bit lines, hindering an increase in speed.

SUMMARY OF THE INVENTION

It is an object of the present invention to provide a data read circuit in a semiconductor device that can perform more rapid discharge of bit lines to improve the data transfer rate of bit lines even when the amount of capacitance that accumulates in bit lines is great, and moreover, that can reduce chip area.

A data read circuit in a semiconductor device according to the present invention comprises a selection means for alternatively reading output data from a plurality of circuit blocks to shared data lines, precharging means for precharging the shared data lines, determination means for determining whether the output data that have been read are to be supplied as output to the outside in accordance with a determination start signal that is synchronized with a selection signal of the selection means; and discharging means that is controlled by the determination results of said determination means; and moreover, that is inserted in a cascade connection in data lines that are shared with a succeeding circuit block. If, based on the determination result, the output data that are to be transferred are at a low level, the discharging means is placed in a conductive state to discharging the shared data lines for the succeeding circuit block, and if the data that are to be transferred are at a high level, the shared data lines for the succeeding circuit block is precharged with said precharging means. This control operation is successively executed, as far as the lowest-order circuit block, to thereby supply data of a logic level that corresponds to said output data as output.

The present invention can reduce chip area while realizing high-speed read that is equivalent to the construction that employs banks of the prior art. In addition, the present invention has a construction in which bit lines are not divided and therefore can reduce energy consumption to approximately $5/8$ that of a case in which the read bit lines are in four divisions.

The above and other objects, features, and advantages of the present invention will become apparent from the following description with reference to the accompanying drawings, which illustrate examples of the present invention.

BRIEF DESCRIPTION OF THE DRAWINGS

FIG. 5 shows an example of a construction in which memory is divided into banks and addresses are selected in bank units;

FIG. 6 is a timing chart for explaining FIG. 5;

FIG. 7 shows an example of the construction of a single-port RAM cell;

DETAILED DESCRIPTION OF THE PREFERRED EMBODIMENTS

Although the present invention will be explained using a semiconductor memory device as an example, the present invention is not limited to a semiconductor memory device. The present invention can be applied to a semiconductor device that comprises: a selection means for selectively reading output data from a plurality of circuit blocks to shared data lines; determination means for determining whether output data that have been read are to be supplied as output to the outside in accordance with a determination start signal, which is synchronized with a selection signal from the selection means; and discharging means that is controlled by the determination results and that is inserted in cascade connection in data lines that are shared with a succeeding circuit block.

First Embodiment

Figure 8:
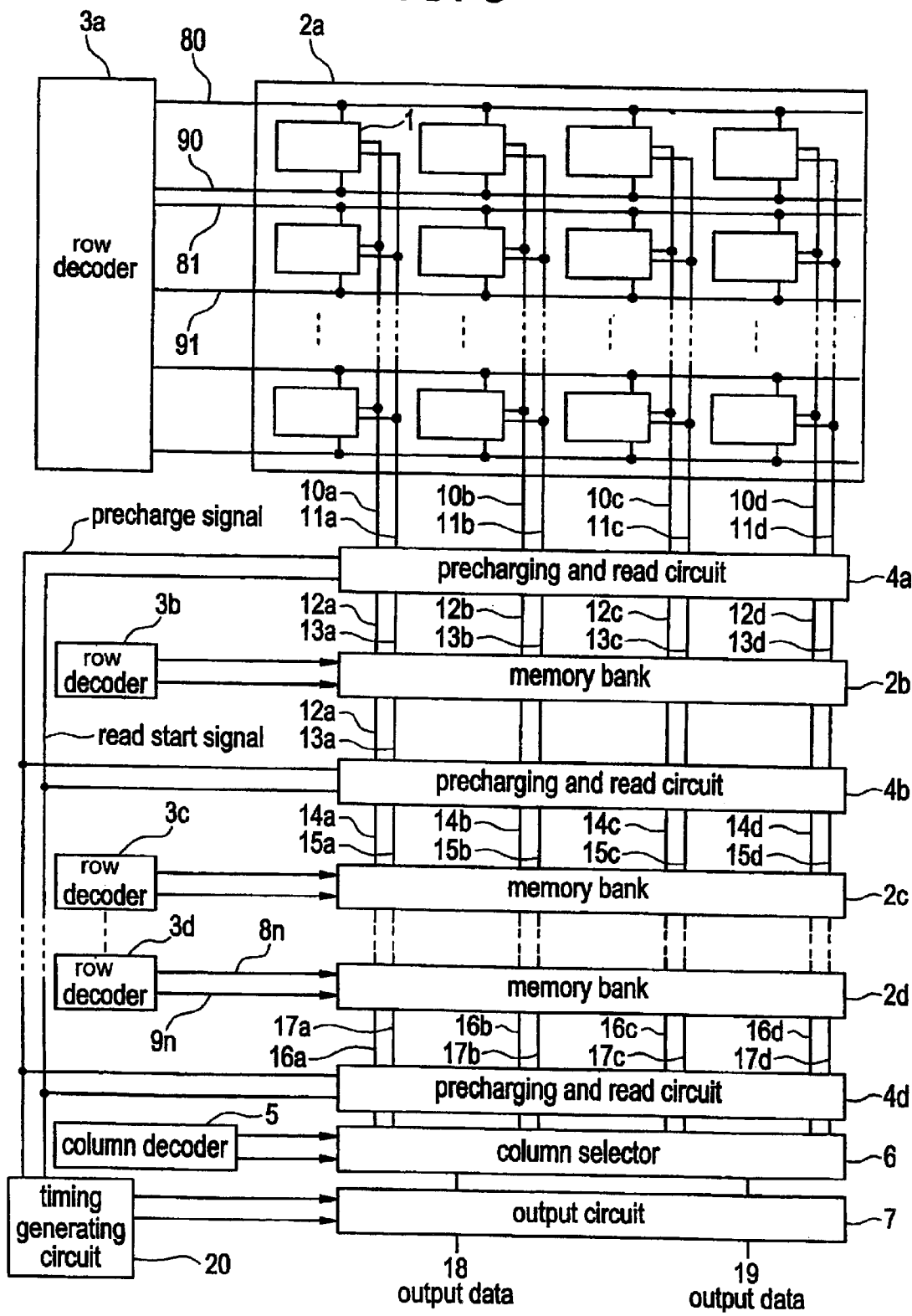
FIG. 8 is a circuit diagram of a read port according to the first embodiment of the present invention;.

Referring now to FIG. 8, a data read circuit according to the first embodiment of the present invention comprises: memory banks 2a, 2b, 2c, and 2d that are each constructed such that a plurality of memory cells 1 are each arranged at the intersections of orthogonal horizontal lines and vertical lines; row decoders 3a, 3b, 3c, and 3d for selecting word lines; precharging and read circuits 4a, 4b, and 4d that are connected to the bit lines of a higher-order memory bank; column decoder 5; column selector 6; output circuit 7, and timing generation circuit 20 for generating precharging signals and read start signals and supplying these signals to precharging and read circuits 4a, 4b, and 4d.

Memory banks 2a, 2b, 2c, and 2d each include word lines 80, 81~8n and 90, 91n~9n that connect to the memory banks. Memory banks 2a, 2b, 2c, and 2d each have the same construction, and for clarity, only the construction of bank 2a will be explained, and explanation of the other banks will be omitted.

Bank 2a will here be taken as the highest-order memory bank, and banks 2b, 2c, and 2d will be considered lower-order memory banks. The output of precharging and read circuit 4a is connected to each of corresponding bit lines 12a, 12b, 12c, 12d, 13a, 13b, 13c, and 13d of lower-order memory bank 2b. Precharging and read circuit 4a that is connected to these bit lines 12a, 12b, 12c, 12d, 13a, 13b, 13c, and 13d is in turn connected to corresponding bit lines of lower-order memory bank 2c. Such connection is continued as far as bit lines 16a, 16b, 16c, 16d, 17a, 17b, 17c, and 17d of lowest-order memory bank 2d.

Figure 1:
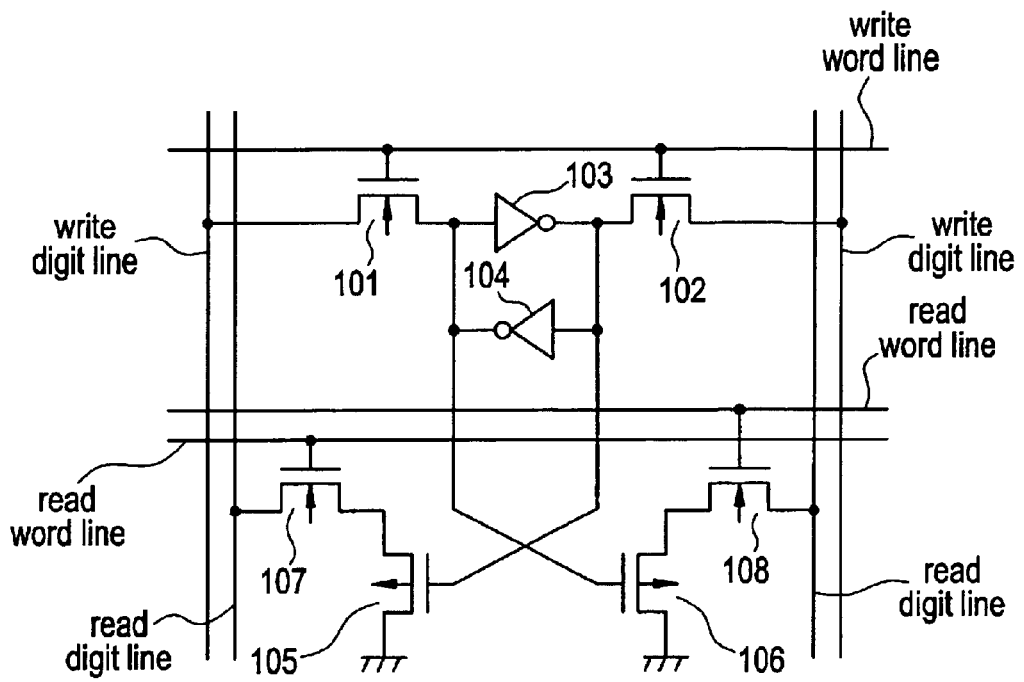
FIG. 1 shows the construction of a multiport memory cell that employs a single-end scheme.
Figure 2:
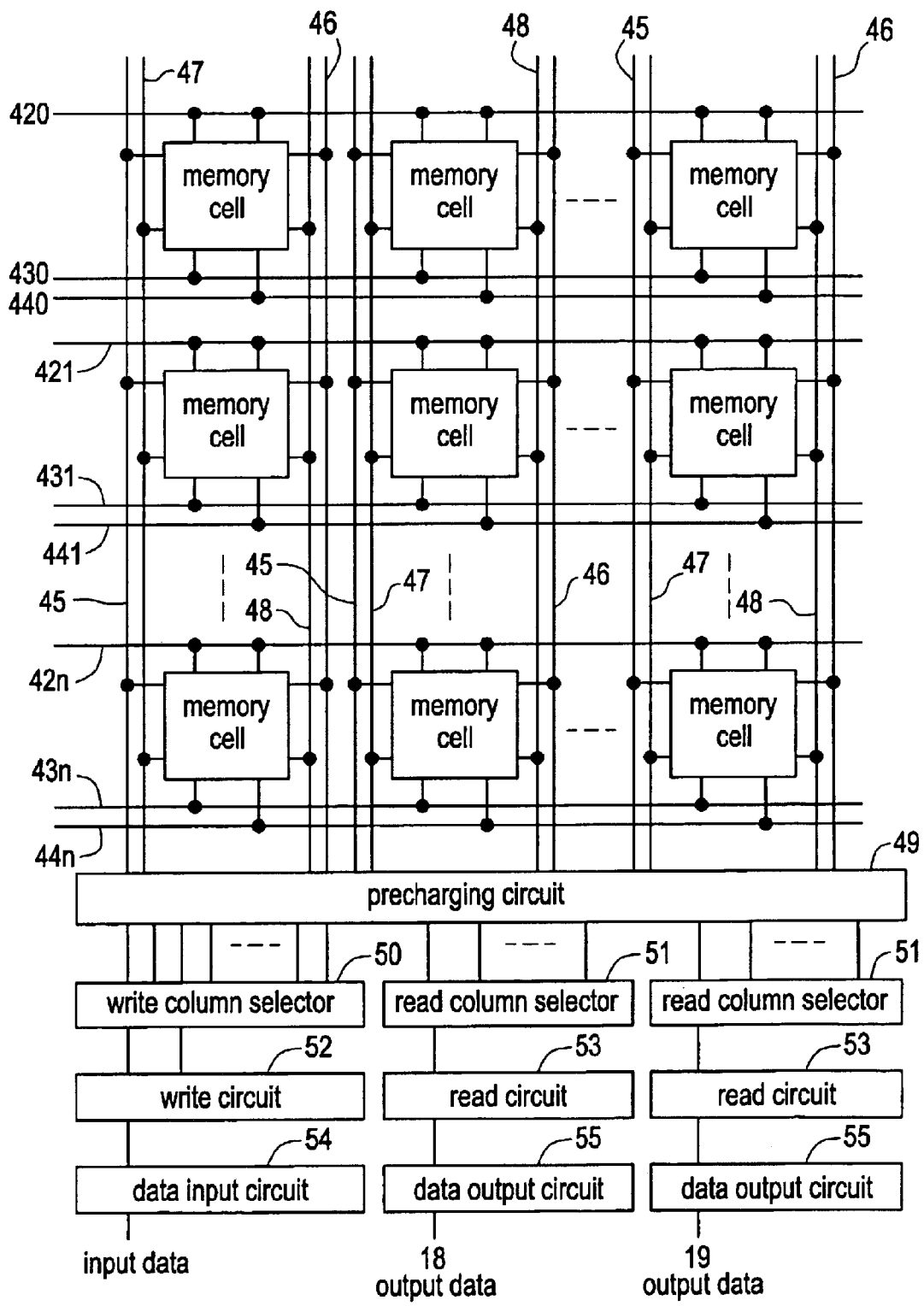
FIG. 2 shows an example of the construction of multiport RAM of the prior art.
Figure 3:
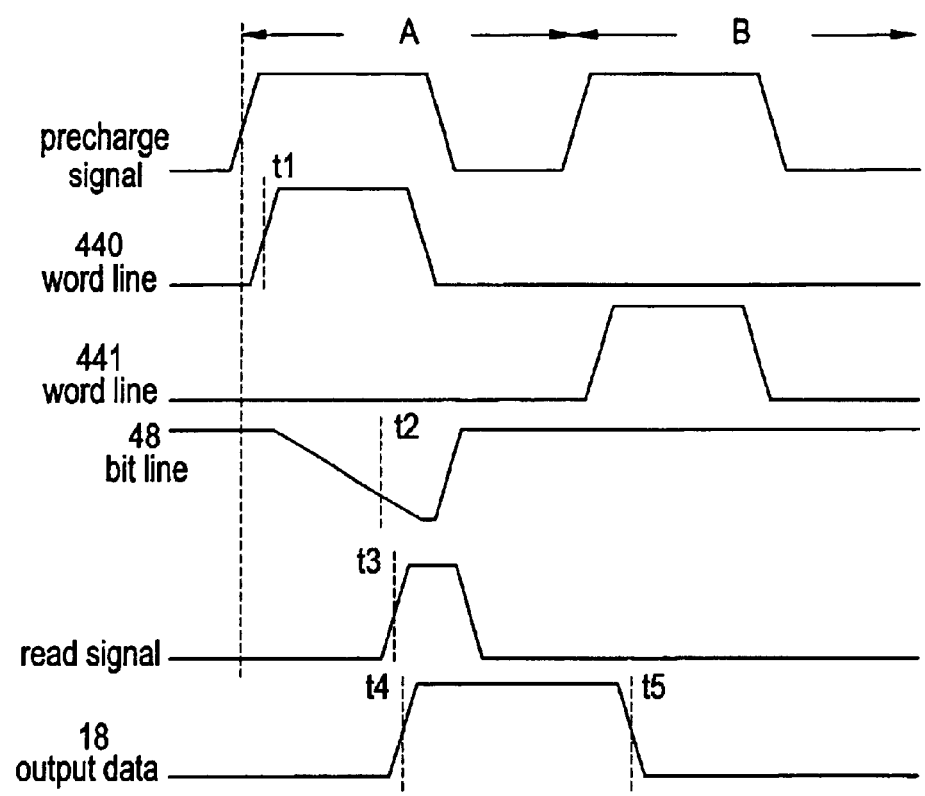
FIG. 3 is a timing chart showing data read by in the single-end scheme.
Figure 4:
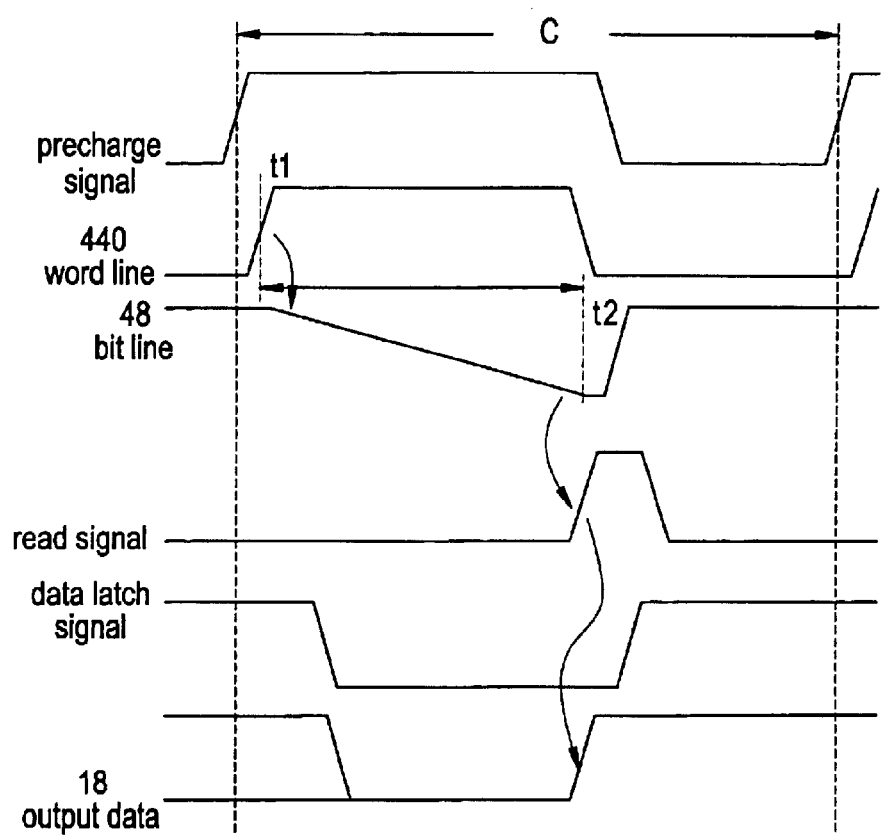
FIG. 4 is a timing chart showing an example in which the discharge time increases due to increase in capacitance of bit lines.

The bit lines of lowest-order memory bank 2d are also connected to precharging and read circuit 4d, the output of which is connected to column selector 6 that is selected by column decoder 5, and the output of column selector 6 is connected to output circuit 7, thereby completing the basic construction of FIG. 1.

Figure 9:
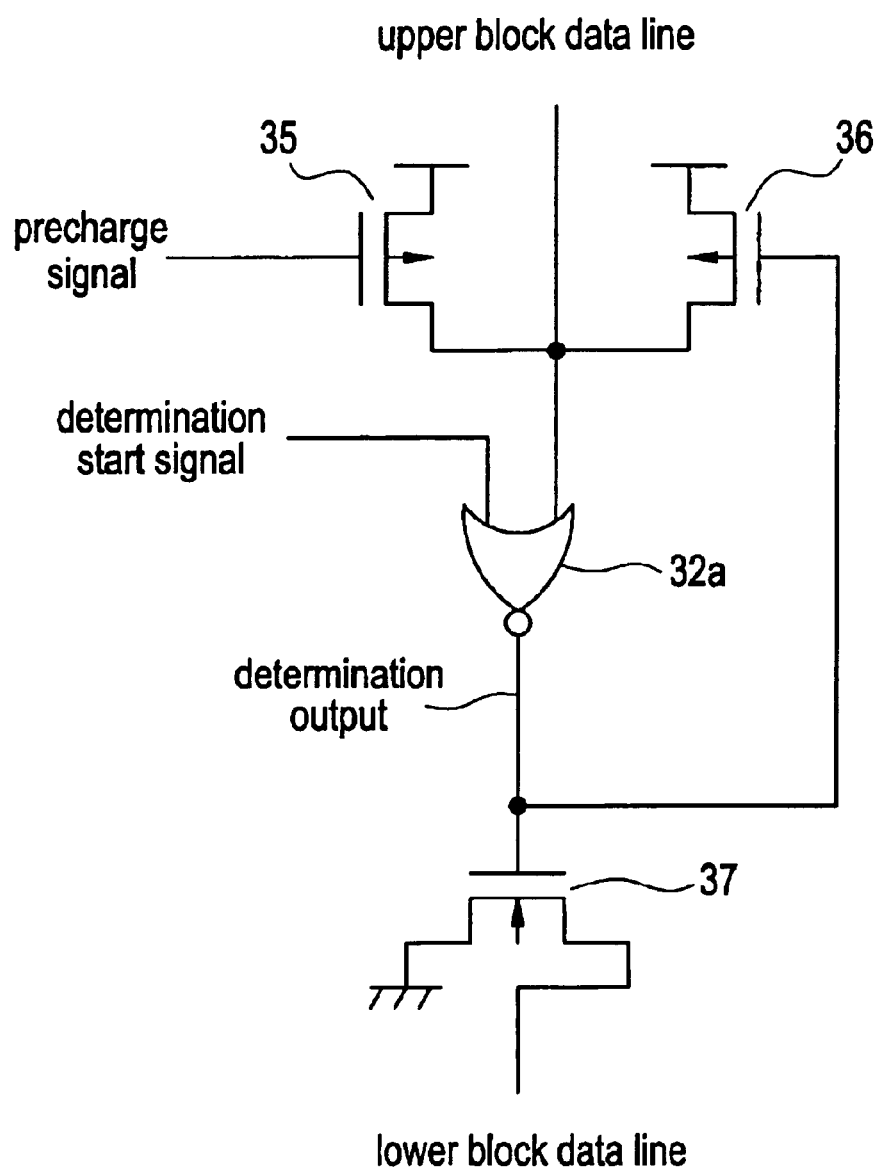
FIG. 9 is a circuit diagram of a first example of determination circuit 32.

Referring now to FIG. 9, a first example of determination circuits 32 that are included in precharging and read circuits 4a, 4b, and 4d includes, NOR 32a having one input terminal connected to a bit line of highest-order memory bank 2a, which is connected in common to the drains of each of PMOS transistor 35 for precharging the bit line and PMOS transistor 36 for maintaining the precharged state during reading, and its other input terminal connected to determination start signal line; and, as a discharging transistor, NMOS transistor 37 having its gate terminal connected to the output terminal of NOR 32a, its source connected to ground, and its drain connected to the bit lines of the lower-order block; the output terminal of NOR 32a being further connected to the gate of PMOS transistor 36.

Constituent elements apart from NOR 32a of the above-described determination circuit, e.g., PMOS transistor 36, may be replaced with other components, for example, a bus folder.

Figure 10:
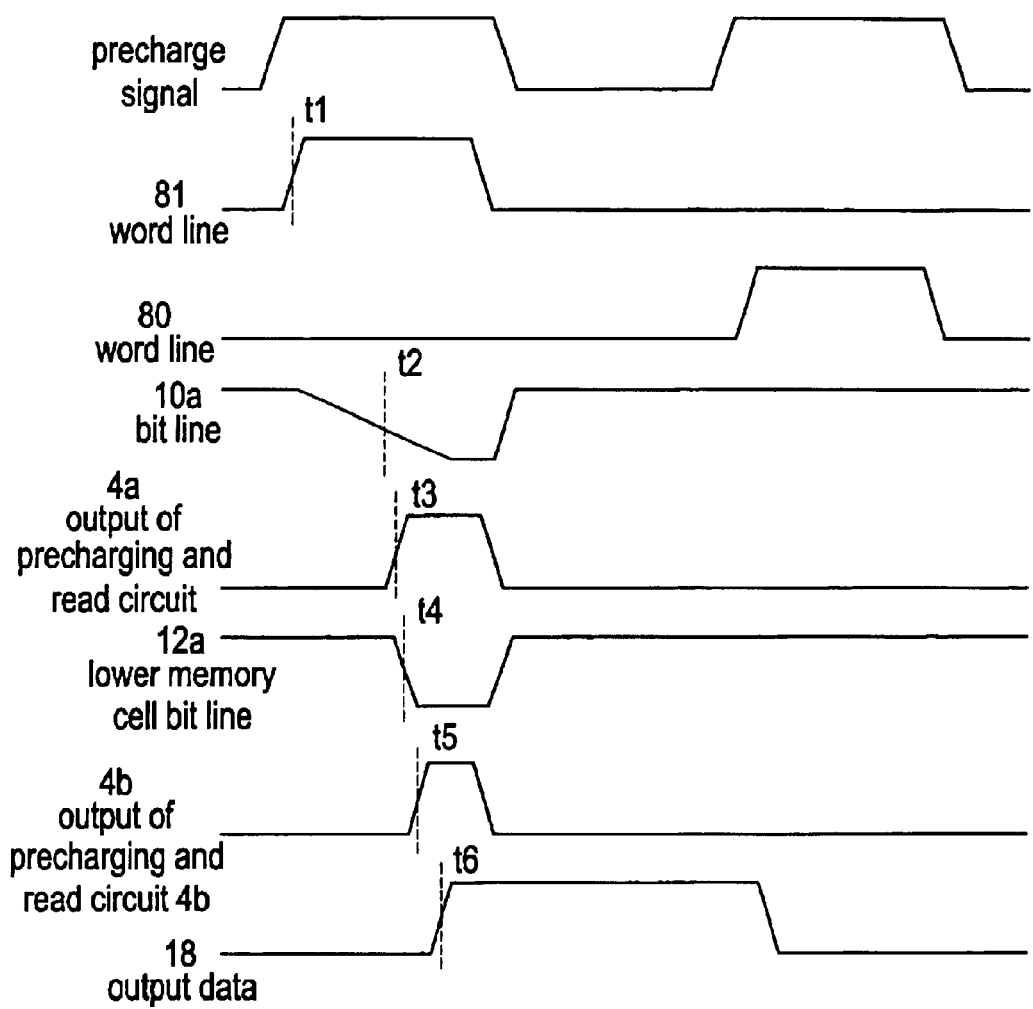
FIG. 10 is a timing chart for explaining the operation of the first embodiment.

The operation of the present embodiment is next described using the timing chart of FIG. 10 in conjunction with FIG. 8 and FIG. 9.

Operation will be described using a case in which, in the circuit of FIG. 8, word line 81 is selected and bit line 10a is discharged, and a case in which word line 80 is selected and bit line 10a is not discharged.

When a row address of highest-order memory bank 2a is selected, the rise of the precharging signal first causes the termination of precharging of the bit lines and the rise of word line 81 at timing t1. The rise of word line 81 at timing t1 causes the access transistors of the memory cell that is connected to word line 81 to conduct, and the data that is held in the memory cell causes discharge of bit line 10a.

Bit line 10a that is discharged gradually drops in electric potential in accordance with the capability of the cell, and when the potential has fallen as far as the logic threshold value of NOR 32a in FIG. 9 that has become effective due to the determination start signal, as shown at timing t2, the output of NOR 32a goes high as shown at timing t3.

The change of the output of NOR 32a to high level causes NMOS transistor 37 of FIG. 9 that is connected to lower-order memory bank 2b to enter the ON (conductive) state, whereby the discharge of bit line 12a of lower-order memory bank 2b begins as shown at timing t4.

Making the capability of NMOS transistor 37 that is associated with the above-described discharging greater than the memory cell capability, or, as will be described hereinbelow, making the transistors larger than transistors 105 and 106 . . . , that are wired-OR connected to the bit lines increases the speed of discharge of lower-order memory bank 2b, and, as shown at timing t5, also causes the output of NOR 38 of the determination circuit of lower-order memory bank 2b to change to high level.

By repeating the above-described operation, data are transferred as far as bit line 16a of lower-order memory bank 2d, and as shown by timing t6, data are transferred to output circuit 7 by way of column selector 6 and supplied as data output 18.

After latching the supplied data, word line 8 is closed, determination start signal is rendered inactive, and the output of NOR 32a of determination circuit 32 is made low level unconditionally, following which the precharging signal is fallen, and the bit lines of all banks are precharged to return to the initial state.

Bit lines 10 for data in which the bit line is not discharged maintain the electric potential that was precharged by PMOS transistor 36 of FIG. 9, and NMOS transistor 37 that is connected to lower-order memory bank 2b remains in the OFF (nonconductive) state. Accordingly, bit line 12a of lower-order memory bank 2b also maintains the precharged state, and these data are transferred as far as output circuit 7 to become the output data.

Next, when a row address of a lower-order memory bank is selected, the bit lines of the higher-order memory bank are maintained at the precharged state by PMOS transistor 36 and the output of NOR 32a of determination circuit 32 is at low level. Accordingly, NMOS transistor 37 maintains the OFF state and no effect is exerted on the bit lines of the lower-order memory bank.

The above-described first embodiment enables high-speed read that is equivalent to the construction that uses banks of the prior art while allowing a reduction in area. The above-described first embodiment also enables a greater increase in speed with large capacity than the example of Japanese Patent No. 2892697 that was described in the prior art. Furthermore, because the above-described first embodiment has a construction in which bit lines are not divided, power consumption in the read bit lines can be reduced to approximately ⅝ that of a case in which bit lines are in four divisions. Still further, since it is assumed that the memory elements themselves output low-level by means of, for example an inverter in the example of Japanese Patent Laid-Open No. H10-134578 that was previously described in the prior art, a construction such as shown in the previously described FIG. 10 could not be employed and the memory elements consequently increased in size. The present invention, however, is advantageous in that it is free of this constraint. In the example of Japanese Patent Laid-Open No. H10-134578, moreover, the control signals that are applied as input to buffer circuits are generated from two address signals and therefore necessitate circuits for decoding, thus entailing a corresponding increase in circuit scale. The present invention, however, only requires synchronization with word lines and thus allows a reduction of circuit scale.

Second Embodiment

Figure 11:
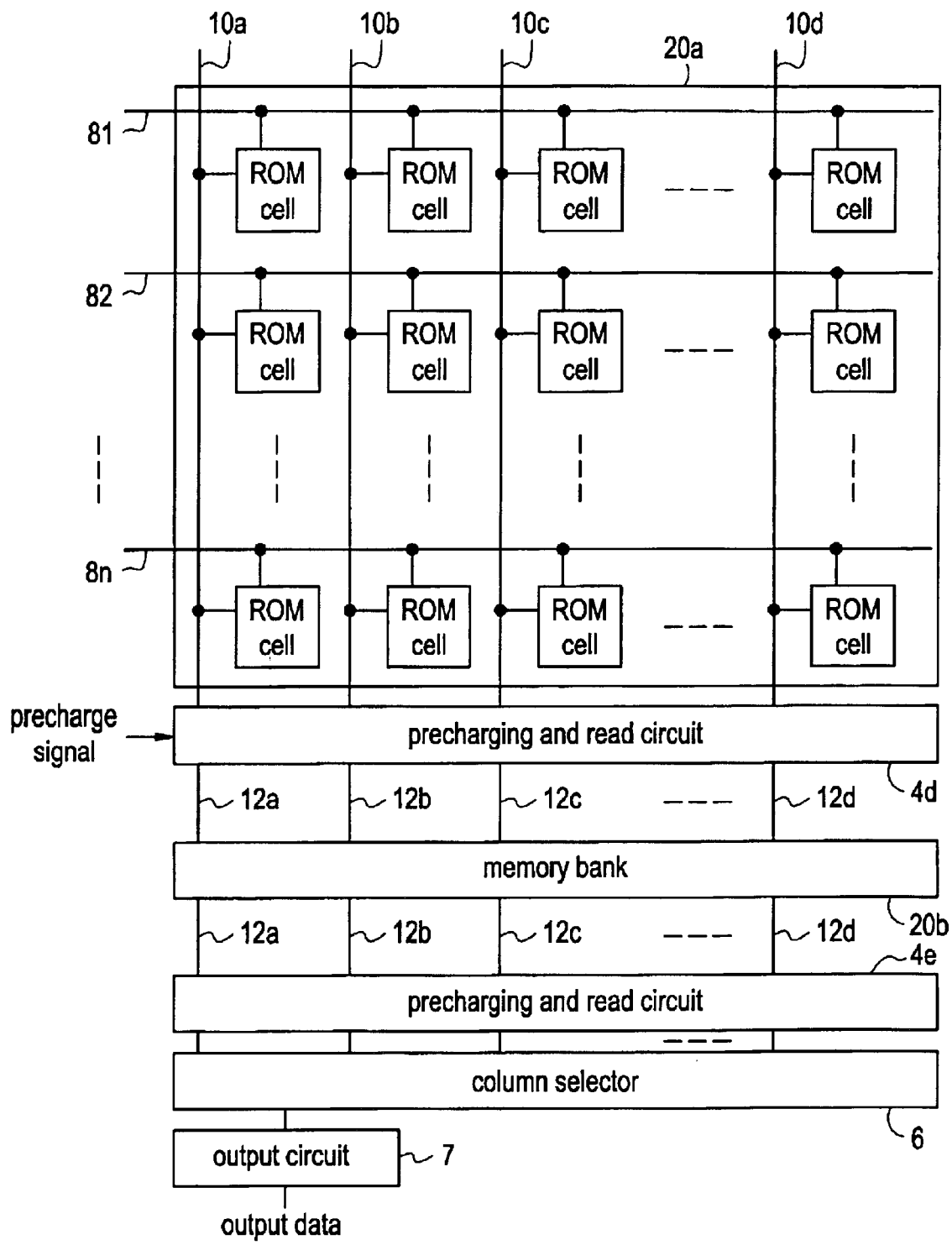
FIG. 11 is a circuit diagram of a second example of determination circuit 32.

FIG. 11 shows an example in which, as the second embodiment of the present invention, the above-described determination circuit is applied to the bit lines of ROM. Specifically, this embodiment comprises memory banks 20a and 20b that are constructed by arranging ROM cells at the intersections of horizontal lines and vertical lines that are arranged in intersecting form; word lines 81n8n that are connected to each of memory banks 20; precharging and read circuit 4d that is connected to bit lines 10a, 10b, 10c, and 10d of higher-order memory bank 20a; the output of this being connected to corresponding bit lines 12a, 12b, 12c, and 12d of lower-order memory bank 20b. The basic construction of this embodiment is ROM having a two-bank construction in which precharging and read circuit 4e is connected to the bit lines of lower-order memory bank 20b, and of the output of this precharging and read circuit 4e, data that have been selected by column selector 6 are supplied as output from output circuit 7.

ROM read operation is performed by using the written ROM codes to discharge or not discharge the precharged data lines that are connected to ROM cells that have been selected by word lines.

This read method is of a construction that is equivalent to the single-end scheme read of a multiport memory, and the present invention is therefore applicable to this method. Connecting a precharging and read circuit that includes determination circuit 32 that was shown in FIG. 9 between the bit lines of higher-order memory bank 20a and lower-order memory bank 20b allows the read result for each bit line to be successively propagated on the bit lines of the lower-order memory bank, as with the above-described multiport memory, and thus enables high-speed data output.

In this second embodiment as well, the bank structure is realized without adding a column selector for each bank, and the chip area can therefore be reduced while maintaining a read speed that is equivalent to the prior art.

Third Embodiment

Figure 12:
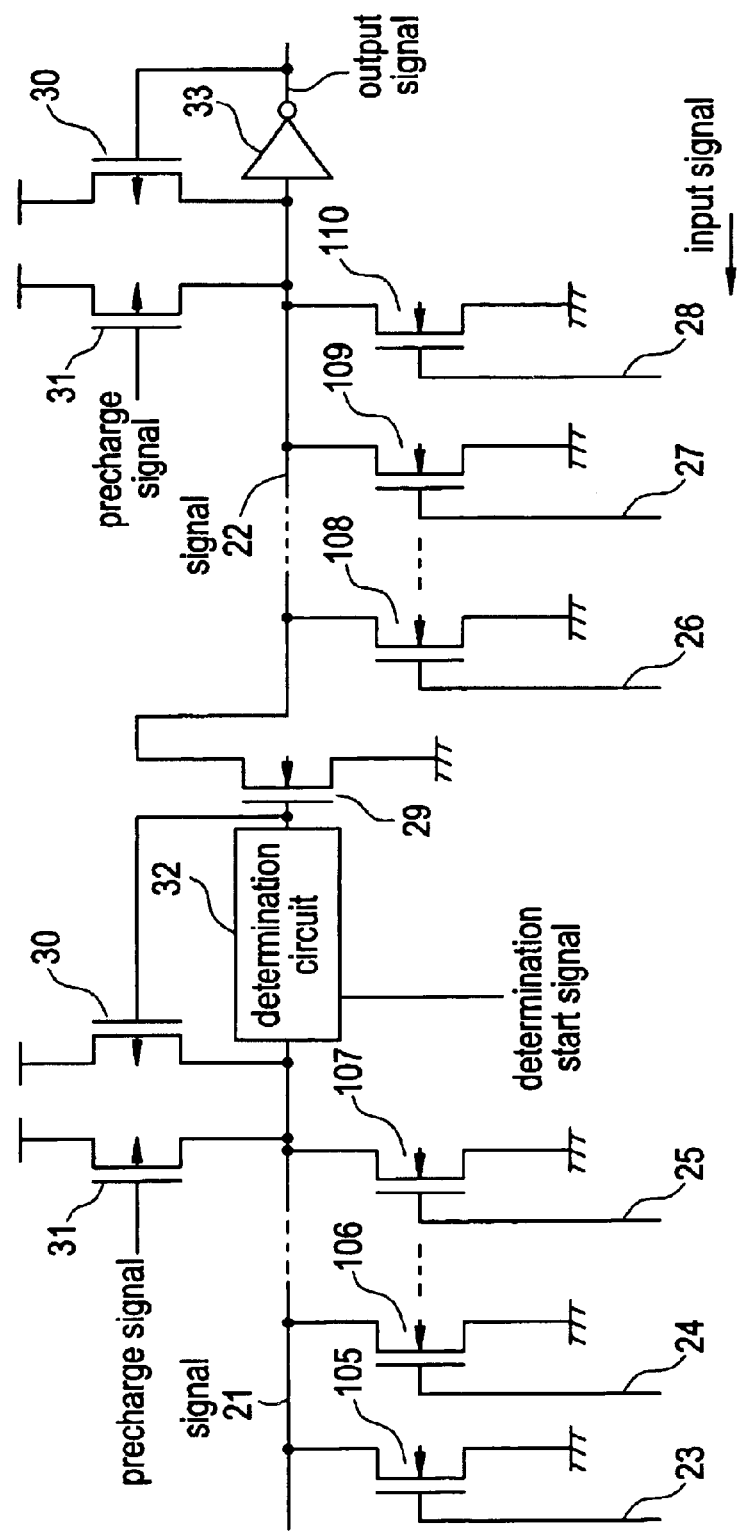
FIG. 12 is a circuit diagram of a third example of determination circuit 32.
Figure 13:
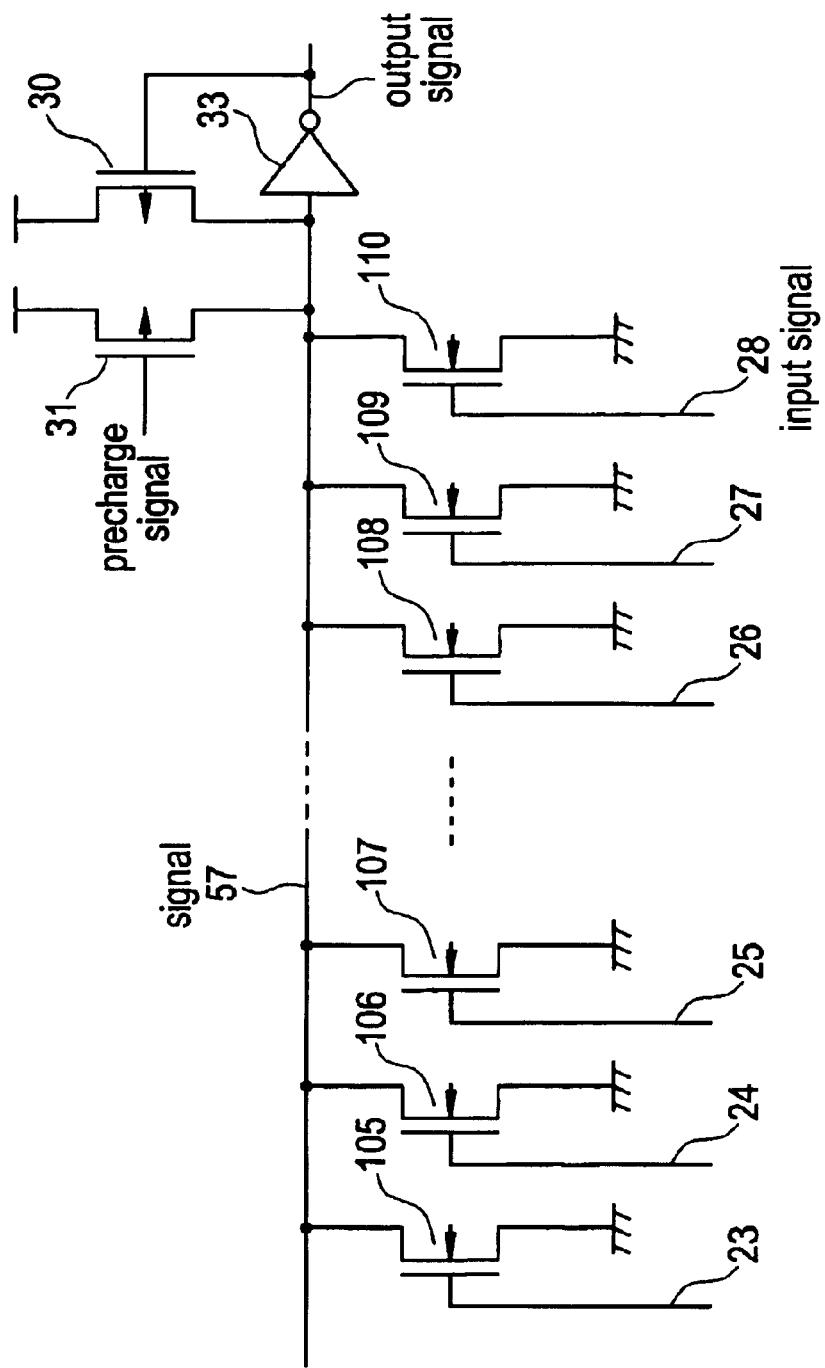
FIG. 13 shows an example of a logic circuit of a wired OR circuit.

Referring now to FIG. 12, the third embodiment is an example in which the present invention has been applied to a logic circuit in which, as shown in FIG. 13, a wired OR circuit is connected to signal line 57 that has been precharged by PMOS transistor 31, which is a precharging transistor.

One example of this type of wired OR circuit is a Match Line in a CAM (Content Addressable Memory) having a search capability. A Match Line is a signal line for communicating the data search results of the CAM, this Match Line changing to low level if there is even one non-matching data.

In FIG. 13, if one or more of the input signals 23~28 of logic circuits 105~110 that are connected by wired OR to precharged signal line 57 is high level, precharged signal line 57 is discharged, thereby changing the signal level of signal line 57 to low level and changing the output signal of inverter 33 to high level.

When a large number of wired OR logic circuits are connected in a circuit of this type, the capacitance of signal line 57 increases and the time necessary for discharging signal line 57 also increases, this increase leading to a delay of the output signal. A single high-level input signal among input signals 23~28 would therefore entail the longest discharge time of signal line 57, and the delay time until the output signal becomes high level would be at a maximum.

The circuit shown in differences from the circuit shown in FIG. 13 in that the bit lines are divided such that signal line 57 is divided into signal line 21 and signal line 22, and it includes determination circuit 32 connected to the bit lines of signal line 21, and the gates of NMOS transistor 29 and PMOS transistor 30.

With the above-described construction, the transition of the determination output to high level causes NMOS transistor 29 to conduct, thereby establishing connection with the bit lines of signal line 22 and causing discharge of the bit lines of signal line 22.

In other words, when the determination result is at low level in signal line 21, signal line 22 of the bit lines of the lower-order bank propagates from signal line 22 the precharge level or the result of the wired OR logic circuit without any influence from signal line 21 of the higher-order bank, this propagated signal becoming the output signal.

Figure 14:
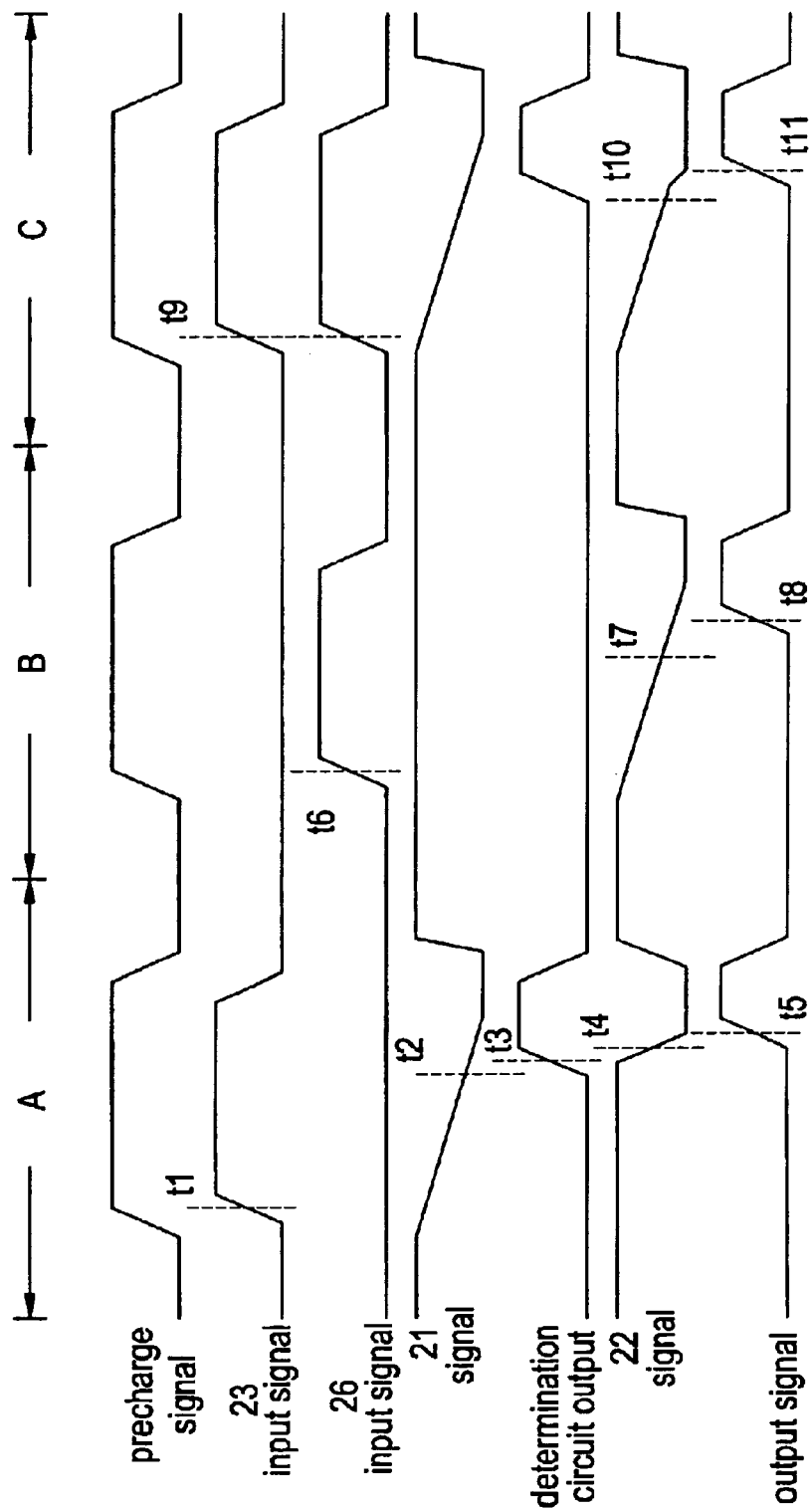
FIG. 14 is a timing chart for explaining the operation of the circuit of FIG. 12.

A case in which only input signal 23 of wired OR changes to high level in interval 32 will be explained with reference to FIG. 14, which shows a timing chart for explaining the operation of the circuit of FIG. 12, to explain First, discharge of the bit lines of signal line 21 that has been precharged during the interval in which precharging signal is at low level is initiated by the change of input signal 23 to high level at timing t1 during the interval in which the precharging signal is at high level.

The discharge of signal line 21 proceeds, and when its potential has fallen as far as the logic threshold value of determination circuit 32 at timing t2, determination circuit 32 supplies a high level as output at timing t3. When determination circuit 32 supplies a high level as output, NMOS transistor 29 conducts at timing t4 and the discharge of signal line 22 is carried out.

The capability of NMOS transistor 29 is designed to be greater (have a larger transistor size) than NMOS transistors 105~110 to which the input signal is connected, and signal line 22 therefore discharges rapidly as far as the logic threshold value of inverter 33 to which it is connected and a high level output signal is supplied as output at timing t5.

In this case, the discharge of signal line 21 is completed in approximately half the discharge time of signal line 57 shown in FIG. 13, and the rapid discharge of signal line 22 enables acceleration of the entire circuit.

A case is next described in which only input signal 26 changes to high level in interval B. The input signal that is applied to signal line 21 is at low level, and signal line 21 therefore maintains a precharged state.

When input signal 26 changes to high level at timing t6, the potential of signal line 22 is discharged by means of NMOS transistor 108, and when the potential has fallen as far as the logic threshold value of inverter 33 at timing t7, inverter 33 supplies a high level as output at timing t8.

Because the capacitance of signal line 22 is approximately half the capacitance of signal line 57 of FIG. 13, the discharge time of signal line 22 is approximately half that of signal line 57, and the data output is therefore accelerated.

Explanation next regards a case in which input signals 23 and 26 change to high level in interval C. When input signals 23 and 26 change to high level at timing t9, the capacitance of both signal lines 21 and 22 is discharged, and when the potential of signal line 22 has fallen as far as the logic threshold value of inverter 33 at timing t10, the output of inverter 33 becomes high level at timing t11.

When a plurality of wired OR logic circuit input signals that are applied to each of signal lines 21 and 22 are high level, the discharge of signal lines 21 and 22 is performed rapidly and the data output therefore attains a high level more rapidly than even the operating speed in interval C.

Fourth Embodiment

Explanation next regards the fourth embodiment, which employs a construction other than NOR 32a that was shown in FIG. 9 in the determination circuit of the read circuit.

Figure 15:
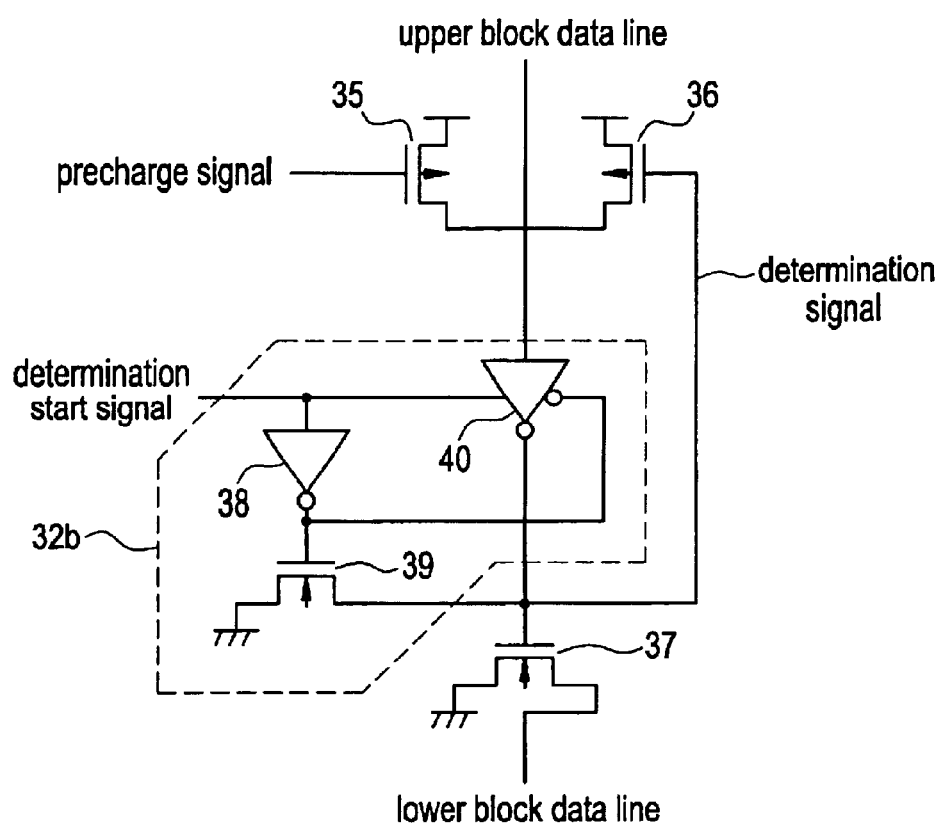
FIG. 15 is a circuit diagram of a fourth example of determination circuit 32.

Referring to FIG. 15, which shows a circuit for a case in which determination circuit 32 is constituted by clocked inverter 40, the input terminal of clocked inverter 40, is connected to each of: the data line of a higher-order block, PMOS transistor 36 for holding the precharged state of the higher-order block data line, and precharging PMOS transistor 35.

The output terminal of clocked inverter 40 is connected to the drain of NMOS transistor 39 for preventing malfunctioning during times of high impedance, the gate of PMOS transistor 36, and the gate of NMOS transistor 37, which is the discharging transistor for discharging the data line of the lower-order block.

In addition, the control terminals of clocked inverter 40 are connected to a determination start signal line for controlling clocked inverter 40 and, by way of inverter 38, to a polarity inverting signal line.

By means of its output, NMOS transistor 39 sets the determination result to low level when the output of clocked inverter 40 and the control of clocked inverter 40 are in a high-impedance state.

Regarding the operation when applying determination circuit 32 of the above-described construction, when the determination start signal is at high level, the supply of inverted data of the data line potential of the higher-order block as the determination output determines whether the data lines of a lower-order block are discharged.

When the determination start signal is at low level, the output of clocked inverter 40 enters a high impedance state, whereby NMOS transistor 39 pulls the determination output down to low level and thus halts the discharge of the lower-order block, thereby enabling a prevention of any influence upon the precharging of the lower-order block data lines.

In addition, in the case of a high-impedance state, NMOS transistor 39 places PMOS transistor 36 in a conductive state and maintains the higher-order block data lines at the precharged potential.

Fifth Embodiment

Figure 16:
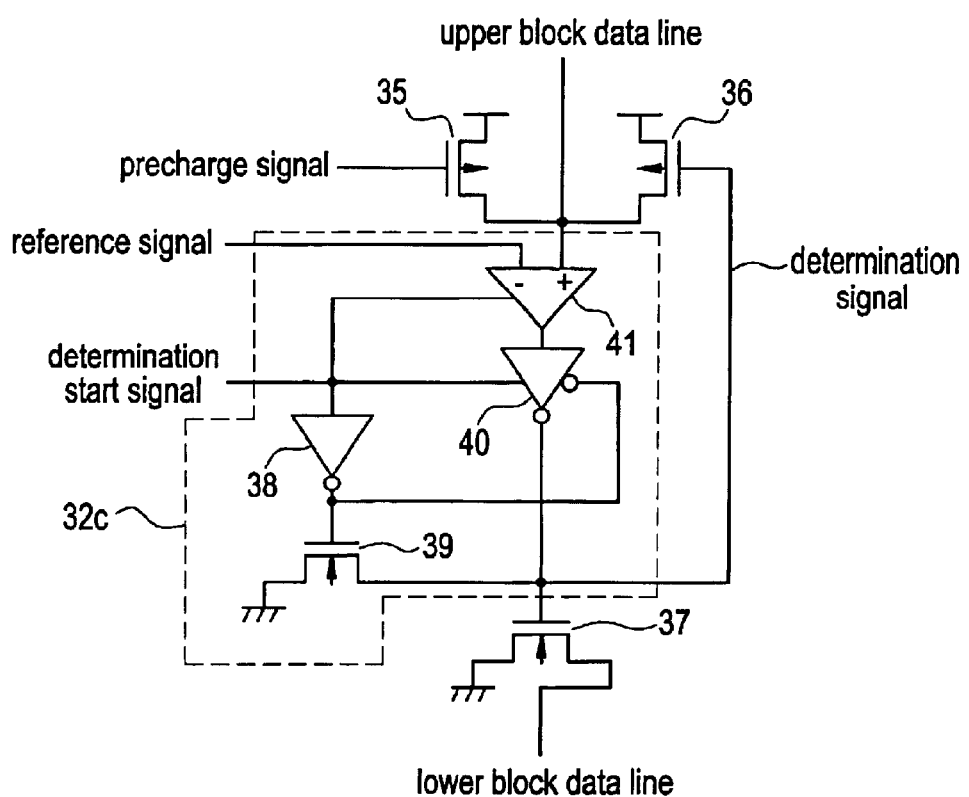
FIG. 16 is a circuit diagram of a fifth example of determination circuit 32.

FIG. 16 shows the fifth embodiment in which yet another construction is used for the determination circuit of the read circuit. The circuit shown in FIG. 16 differs from the circuit shown in FIG. 15 in its provision of differential sense amplifier 41 having its positive input terminal connected to the higher-order block data lines, connected to its negative input terminal a reference signal line, and its control input terminal connected to the determination start signal line; and clocked inverter 40 having its input terminal connected to the output terminal of differential sense amplifier 41.

In this embodiment, when the determination start signal is at high level, differential sense amplifier 41 compares the data lines of the higher-order block with the reference signal, amplifies the voltage differential and supplies it as output, Clocked inverter 40 inserts the polarity of the output of differential sense amplifier 41 and determines whether or not to carry out discharge of the data lines of the lower-order block.

Since the voltage differential between the data lines of the higher-order block and the reference signal is found by differential sense amplifier 41, there is no need for waiting until the potential of the data lines drops as far as the threshold value of the next section, and the operation is thus accelerated.

When the determination start signal is at low level, the output of clocked inverter 40 enters a high-impedance state, whereby the determination output is changed to low level by NMOS transistor 39, NMOS transistor 37 is turned off, and the discharge of the lower-order block is halted.

While preferred embodiments of the present invention have been described using specific terms, such description is for illustrative purposes only, and it is to be understood that changes and variations may be made without departing from the spirit or scope of the following claims.

What is claimed is:

1. A data read circuit in a semiconductor device, comprising:

selection means for selectively reading output data from a plurality of circuit blocks to shared data lines;

precharging means for precharging said shared data lines;

determination means for determining whether said output data that have been read are to be supplied as output to the outside in accordance with a determination start signal that is synchronized with a selection signal for said selection means; and discharging means for being controlled by the determination result of said determination means, and being inserted in a cascade connection in data lines that are shared with a succeeding circuit block;

whereby a control operation that if, based on the determination result, the output data that are to be transferred are at a low level, said discharging means is placed in a conductive state to discharging the shared data lines for the succeeding circuit block, and if the data that are to be transferred are at a high level, the shared data lines for the succeeding circuit block is precharged with said precharging means, is successively executed, as far as the lowest-order circuit block, to thereby supply data of a logic level that corresponds to said output data as output.

2. A data read circuit according to claim 1, wherein:

said circuit block is a bank block of a memory circuit;

said selection means comprises a row decoder, horizontal lines, and a column decoder;

said selection signal is a horizontal line; and said shared data lines are vertical lines.

3. A data read circuit in a semiconductor device, comprising:

a plurality of banks each having multiport memory cells for transferring data of each memory cell through a single bit line in accordance with a single-end scheme;

determination means for determining, in accordance with a determination start signal that is synchronized with a word line signal, whether data in each bank that are read to said single bit line are to be supplied as output;

discharging means that enters a conductive state when a determination result of said determination means indicates that output is possible, for discharging the single bit line of a succeeding bank; and precharging means for precharging said single bit line; and read means that is interposed between said banks;

whereby a control operation, based on the determination result of said determination means for determining whether data transfer by said read means in the succeeding bank is allowed, is successively executed, as far as the lowest-order bank, to perform a desired data transfer.

4. A data read circuit according to claim 3, wherein said read means includes:

a single bit line that is selectively precharged by a precharging transistor and a precharge holding transistor that is connected in parallel with said precharging transistor;

a NOR circuit having its input terminal connected to said bit line and the signal line of said determination start signal, and its output terminal connected to the gate electrode of said precharge holding transistor; and a discharging transistor having its gate electrode connected to the output terminal of said NOR circuit, its drain electrode connected to a lower-order bit line, and its source electrode connected to the ground potential.

5. A data read circuit according to claim 4, wherein the drive capability of said discharging transistor is preset to a level that equals or surpasses the drive capability of a plurality of circuit blocks within the semiconductor device.

6. A data read circuit of a semiconductor device, comprising:

a plurality of banks each having multiport memory cells for transferring data of each memory cell through a single bit line in accordance with a single-end scheme; and read means that is interposed between said banks for supplying data that have been read to a single bit line for each of said banks;

said read means including:

a single NOR means for receiving as input said data and a determination start signal for determining, in synchronization with a word line signal, whether said data are to be transferred; and discharging means for discharging a lower-order bit line in accordance with an output result of the NOR means;

whereby a control operation, based on a determination result of said NOR means for determining whether data transfer by said read means in a succeeding bank is allowed, is successively executed, as far as the lowest-order bank, to thereby perform a desired data transfer.

7. A data read circuit according to claim 6, wherein said read means includes:
- a single bit line that is selectively precharged by a precharging transistor and a precharge holding transistor that is connected in parallel with said precharging transistor;
- wherein the singe NOR means comprises a clocked inverter having its data input terminal connected to said bit line, one of its clock input terminals connected to the determination start signal, the other of its clock input terminals connected to a polarity-inverted signal of said determination start signal, and its output terminal connected to the gate electrode of said precharge holding transistor;
- an output holding transistor having its drain electrode connected to the output terminal of said clocked inverter, its source electrode connected to ground, and its gate electrode connected to the polarity-inverted signal of said determination start signal; and
- wherein the discharging means comprises a discharging transistor having its gate electrode connected to the output terminal of said clocked inverter, its drain electrode connected to said lower-order bit line, and its source electrode connected to ground.

8. A data read circuit according to claim 7, wherein the drive capability of said discharging transistor is preset to a level that equals or surpasses the drive capability of a plurality of circuit blocks within the semiconductor device.

9. A data read circuit in a semiconductor device, comprising:
- a plurality of banks having read-only memory cells for transferring data of each cell through a single bit line; and
- read means that is interposed between said banks for supplying data that have been read to a single bit line for each of said banks as output to the outside;
- said read means including:
- a single NOR means for receiving as input said data and a determination start signal for determining, in synchronization with a word line signal, whether said data are to be transferred; and
- discharging means for discharging the lower-order bit line in accordance with the output result of said NOR means;
- whereby a control operation, based on the determination result of said NOR means of a particular bank, for determining whether data transfer by said read means of the succeeding bank is allowed, is successively executed, as far as the lowest-order bank, to thereby perform execute the desired data transfer.

10. A data read circuit according to claim 9, wherein said read means includes:
- a single bit line that is selectively precharged by a precharging transistor and a precharge holding transistor that is connected in parallel with said precharging transistor;
- wherein the single NOR means comprises a clocked inverter having its data input terminal connected to said bit line, one of its clock input terminals connected to the determination start signal, the other of its clock input terminals connected to a polarity-inverted signal of said determination start signal, and its output terminal connected to the gate electrode of said precharge holding transistor;
- an output holding transistor having its drain electrode connected to the output terminal of said clocked inverter, its source electrode connected to ground, and its gate electrode connected to the polarity-inverted signal of said determination start signal; and
- wherein the discharging means comprises a discharging transistor having its gate electrode connected to the output terminal of said clocked inverter, its drain electrode connected to said lower-order bit line, and its source electrode connected to ground.

11. A data read circuit according to claim 10, wherein the drive capability of said discharging transistor is preset to a level that equals or surpasses the drive capability of a plurality of circuit blocks within the semiconductor device.

12. A data read circuit in a semiconductor device, comprising:
- a plurality of banks each constituted by predetermined logic circuits;
- data output lines provided inside each of said banks;
- wired OR circuits in which transistors each controlled by a predetermined input signal are connected by wired OR to said data output lines; and
- read means that is interposed between said banks for reading output data of said wired OR circuits;
- said read means including:
- a single NOR means for receiving as input said output data and a determination start signal that is of the opposite phase of a precharging signal to precharge one of said data output lines for determining whether or not said output data are to be transferred; and
- discharging means for discharging a lower-order data output line in accordance with an output result of the NOR means;
- whereby a control operation, based on a determination result of said NOR means for determining whether data transfer by said read means in a succeeding bank is allowed, is successively executed, as far as the lowest-order bank, to thereby perform a desired data transfer.

13. A data read circuit according to claim 12, wherein said read means includes:
- a single bit line for being selectively precharged by a precharging transistor and a precharge holding transistor connected in parallel with said precharging transistor;
- wherein the single NOR means comprises a voltage comparator having its positive input terminal connected to said bit line, its negative input terminal connected to a reference signal line, and its control terminal connected to a determination start signal line, and
- a clocked inverter having its data input terminal connected to the output terminal of said voltage comparator, one of its clock input terminals connected to said determination start signal, the other of its clock input terminals connected to the polarity-inverted signal of said determination start signal; and its output terminal connected to the gate electrode of said precharge holding transistor;
- an output holding transistor having its drain electrode connected to the output terminal of said clocked inverter, its source electrode connected to the ground potential, and its gate electrode connected to the polarity-inverted signal of said determination start signal; and wherein the discharging means comprises a discharging transistor having its gate electrode connected to the output terminal of said clocked inverter, its drain electrode connected to a lower-order bit line, and its source electrode connected to the ground potential.

14. A data read circuit according to claim 13, wherein the drive capability of said discharging transistor is preset to a level that equals or surpasses the drive capability of a plurality of circuit blocks within the semiconductor device.

15. A data read circuit of a semiconductor device, comprising:

a plurality of banks each having multiport memory cells for transferring data of each memory cell through a single bit line in accordance with a single-end scheme; and read means that is interposed between said banks for supplying data that have been read to a single bit line for each of said banks;

said read means including:

a clocked inverter for supplying as output said data when a determination start signal, which is synchronized with a word line signal, for determining whether or not said data are to be transferred is in an active state;

discharging means for discharging a lower-order bit line in accordance with an output result of said clocked inverter; and discharge prevention means for preventing the discharging of said discharging means and holding the input of said clocked inverter at a precharged potential when said determination start signal is in an inactive state;

whereby a control operation, based on the output result of said clocked inverter for determining whether data transfer by said read means in a succeeding bank is allowed, is successively executed, as far as the lowest-order bank to thereby perform a desired data transfer.

16. A data read circuit in a semiconductor device, comprising:

a plurality of banks each having multiport memory cells for transferring data of each memory cell through a single bit line in accordance with a single-end scheme; and read means that is interposed between said banks for supplying data that have been read to a single bit line for each of said banks;

said read means including:

a differential sense amplifier for comparing said data that are transferred with a reference signal when a determination start signal, which is synchronized with a word line signal, for determining whether or not said data are to be transferred is in an active state;

a clocked inverter for receiving as input said data that are supplied from said differential sense amplifier and supplying said data as output when said determination start signal is in an active state;

discharging means for discharging a lower-order bit line in accordance with an output result of said clocked inverter; and discharge prevention means for preventing the discharging of said discharging means and holding the input of said clocked inverter at a precharged potential when said determination start signal is in an inactive state;

whereby a control operation, based on the output result of said clocked inverter for determining whether data transfer by said read means in a succeeding bank is allowed, is successively executed, as far as the lowest-order bank, to thereby perform desired data transfer.

* * * * *